(12) United States Patent
Heberle

(10) Patent No.: US 6,351,478 B1
(45) Date of Patent: Feb. 26, 2002

(54) PASSIVELY COOLED SOLID-STATE LASER

(75) Inventor: Geoffrey O. Heberle, Chesterfield, MO (US)

(73) Assignee: Cutting Edge Optronics, Inc., St. Charles, MO (US)

( * ) Notice: Subject to any disclaimer, the term of this patent is extended or adjusted under 35 U.S.C. 154(b) by 0 days.

(21) Appl. No.: 09/151,851

(22) Filed: Sep. 11, 1998

(51) Int. Cl.⁷ .................................................. H01S 3/04
(52) U.S. Cl. ........................ 372/36; 372/39; 372/75
(58) Field of Search ............................. 372/75, 35, 36, 372/39, 70; 126/618

(56) References Cited

U.S. PATENT DOCUMENTS

| | | | |
|---|---|---|---|
| 3,683,296 A | 8/1972 | Scalise | 331/94.5 |
| 4,057,101 A | 11/1977 | Ruka et al. | 165/1 |
| 4,092,614 A | 5/1978 | Sakuma et al. | 331/94.5 P |
| 4,219,072 A | 8/1980 | Barlow, Sr. | 165/32 |
| 4,228,406 A | 10/1980 | Lewis et al. | 331/94.5 D |
| 4,233,567 A | 11/1980 | Chernoch | 331/94.5 P |
| 4,315,225 A | 2/1982 | Allen, Jr. et al. | 372/35 |
| 4,393,393 A | 7/1983 | Allen. Jr. et al. | 357/81 |
| 4,415,234 A | 11/1983 | Meyers | 350/310 |
| 4,454,602 A | 6/1984 | Smith | 372/36 |
| 4,573,067 A | 2/1986 | Tuckerman et al. | 357/82 |
| 4,673,030 A * | 6/1987 | Basiulis | 165/32 |
| 4,709,750 A | 12/1987 | White | 165/10 |
| 4,852,109 A | 7/1989 | Kuchar | 372/34 |
| 4,881,233 A | 11/1989 | von Arb et al. | 372/35 |
| 4,963,741 A * | 10/1990 | McMullin | 250/338.3 |
| 5,005,640 A | 4/1991 | Lapinski et al. | 165/170 |
| 5,076,348 A | 12/1991 | Bluege | 165/104.17 |
| 5,105,429 A | 4/1992 | Mundinger et al. | 372/34 |
| 5,220,954 A | 6/1993 | Longardner et al. | 165/10 |
| 5,253,260 A * | 10/1993 | Palombo | 372/34 |
| 5,265,113 A | 11/1993 | Halldörsson et al. | 372/36 |
| 5,315,154 A * | 5/1994 | Elwell | 257/707 |
| 5,394,427 A | 2/1995 | McMinn et al. | 372/70 |
| 5,520,244 A | 5/1996 | Mundinger et al. | 165/104.33 |
| 5,734,672 A | 3/1998 | McMinn et al. | 372/50 |

FOREIGN PATENT DOCUMENTS

| | | | |
|---|---|---|---|
| WO | WO 96/28846 | 9/1996 | H01L/23/427 |

OTHER PUBLICATIONS

Printed Pages entitled "PCM Cooling Devices" from web site: www.mjm–engineering.com, prior to filing date.

* cited by examiner

*Primary Examiner*—James W. Davie
*Assistant Examiner*—Gioacchino Inzirillo
(74) *Attorney, Agent, or Firm*—Jenkens & Gilchrist

(57) ABSTRACT

A passively cooled solid-state laser system for producing high-output power is set forth. The system includes an optics bench assembly containing a laser head assembly which generates a high-power laser beam. A laser medium heat sink assembly is positioned in thermal communication with the laser medium for conductively dissipating waste heat and controlling the temperature of the laser medium. A diode array heat sink assembly is positioned in thermal communication with the laser diode array assembly for conductively dissipating waste heat and controlling the temperature of the laser diode array assembly. The heat sink assemblies include heat exchangers with extending surfaces in intimate contact with phase change material. When the laser system is operating, the phase change material transitions from solid to liquid phase.

30 Claims, 9 Drawing Sheets

PASSIVELY COOLED SOLID-STATE LASER

FIELD OF THE INVENTION

The present invention relates generally to a solid-state laser system and, in particular, to a solid-state laser that is passively cooled by heat sink bodies containing phase change material.

BACKGROUND OF THE INVENTION

Solid-state laser systems are characterized in that they have a solid-state laser gain medium which converts energy from an optical pump source to a coherent output laser beam. The pump source can be one of many available energy-producing systems such as flash lamps or semiconductor laser diodes. The energy produced by the pump source is incident upon the laser medium and absorbed by the laser medium.

The absorbed energy in the laser medium causes the atoms in the laser medium to be excited and placed in a higher energy state. Once at this higher state, the laser medium releases its own energy which is placed into an oscillating state by the use of a laser resonator. The laser resonator includes at least two reflective surfaces located on either side of the laser medium. The laser resonator can be designed to continuously release a laser beam from the system. Alternatively, the resonator can be designed such that when the energy oscillating through the laser medium reaches a predetermined level, it is released from the system as a high-power, short-duration laser beam. The emitted light produced from the solid-state laser system is generally coherent and exits the system in a predefined area.

In many systems, the laser medium is Neodymium-doped, Yttrium-Aluminum Garnet (Nd:YAG). A laser medium made from Nd:YAG absorbs optical energy most readily when the energy is at a wavelength of approximately 808 nanometers (nm). Thus, the source to pump the Nd:YAG laser medium should be emitting light energy at approximately 808 nm. Gallium arsenide semiconductor laser diodes can be manufactured with dopants (e.g. aluminum) that will cause the emitted light to be in a variety of wavelengths, including 808 nm. Thus, the semiconductor laser diodes, which are lasers by themselves, act as the pump source for the laser medium.

The conversion of optical energy into coherent optical radiation is accompanied by the generation of heat which must be removed from the device. Cooling of the laser medium reduces the build-up of temperature gradients and, thereby, the strain and stress in the laser medium and also avoids the likelihood of laser medium fracture due to high thermo-elastic stress. Also, variation of the refractive index and its associated optical distortion can be largely controlled or avoided by effective cooling. The result is improved beam quality and/or increased average output power.

Diode array performance is also strongly dependent on temperature. Not only is the output power a function of temperature, but the wavelength of the emitted energy that is to be absorbed by the laser medium is also a function of diode temperature. To maintain desired array performance and to prevent the diode array from being destroyed by overheating, cooling of the area surrounding the array is also important.

It has been an objective for laser manufacturers to develop high-power, solid-state systems. As the output power in these system increases, the waste heat increases which puts more demands on cooling systems and necessitates larger volumes in which to provide adequate cooling. Hence, the efficient and effective removal of waste heat from both the diode arrays and the laser medium is an important factor in developing compact, high-powered laser systems.

Known laser systems utilize active cooling. Active cooling usually requires mechanical pumps, coolant carrying tubing operated at pressure, and electrical supplies to drive the pumps. Another example of a system that utilizes active cooling is one that incorporates thermoelectric coolers. However, these thermo-electric coolers are inefficient and require additional power to control the temperature of the laser. Thus, active cooling requires additional input power to the laser system. It also requires the use of additional space and can often make the laser system quite heavy.

SUMMARY OF THE INVENTION

The present invention is a passively cooled, diode-pumped solid-state laser system producing a high-power laser beam. The system includes at least one diode array producing optical energy that is absorbed by a solid-state laser medium. The solid-state laser medium has a central axis and an outer surface into which optical energy from the diode array is emitted.

The system also includes means for producing laser resonation substantially optically aligned along the central axis of the laser medium. The resonating means include a pair of opposing reflective surfaces positioned with the laser medium therebetween. One of the opposing reflective surfaces is an output coupling mirror for reflecting a portion of energy produced by the laser medium to provide laser resonation and also for transmitting the high-power laser beam.

To provide the passive cooling of the laser medium, a laser medium heat sink assembly contains a substantially solid form of phase change material in thermal communication with the outer surface of the laser medium. The solid form of the phase change material changes to a liquid form of the phase change material in response to heat from the laser medium being transferred to the laser medium heat sink assembly.

To absorb the heat from the laser diodes, a diode array heat sink assembly contains a substantially solid form of phase change material in thermal communication with the diode array. The solid form of the phase change material changing to a liquid form of the phase change material in response to heat from the diode array being transferred to the diode array heat sink assembly.

While the laser system cannot be operated endlessly with only passive cooling, passive cooling can provide the necessary cooling for a laser system for several minutes. Such a system can be useful in many applications such as the terminal guidance system for a missile. Advantages to be gained from passive cooling include more compact, portable, lighter, and vibration free laser systems. Additionally, a laser system with more effective passive cooling can accommodate the increased heat transfer associated with a more powerful laser.

Furthermore, employing a phase change material that transitions from solid to liquid phase as a working medium in a heat exchanger provides thermal control properties in addition to heat dissipation qualities. Thermal control is provided by the latent heat associated with the phase change material. A material in its solid phase will continue to absorb energy and remain at a constant temperature (its melting point) until a specified amount of energy is absorbed completing the transition from solid to liquid phase.

Furthermore, an interface in intimate contact with the phase change material proceeding through this transition will be held approximately constant at the material's melting temperature until the transition is complete.

BRIEF DESCRIPTION OF THE DRAWINGS

Other objects and advantages of the invention will become apparent upon reading the following detailed description and upon reference to the drawings in which.

Figure 1:
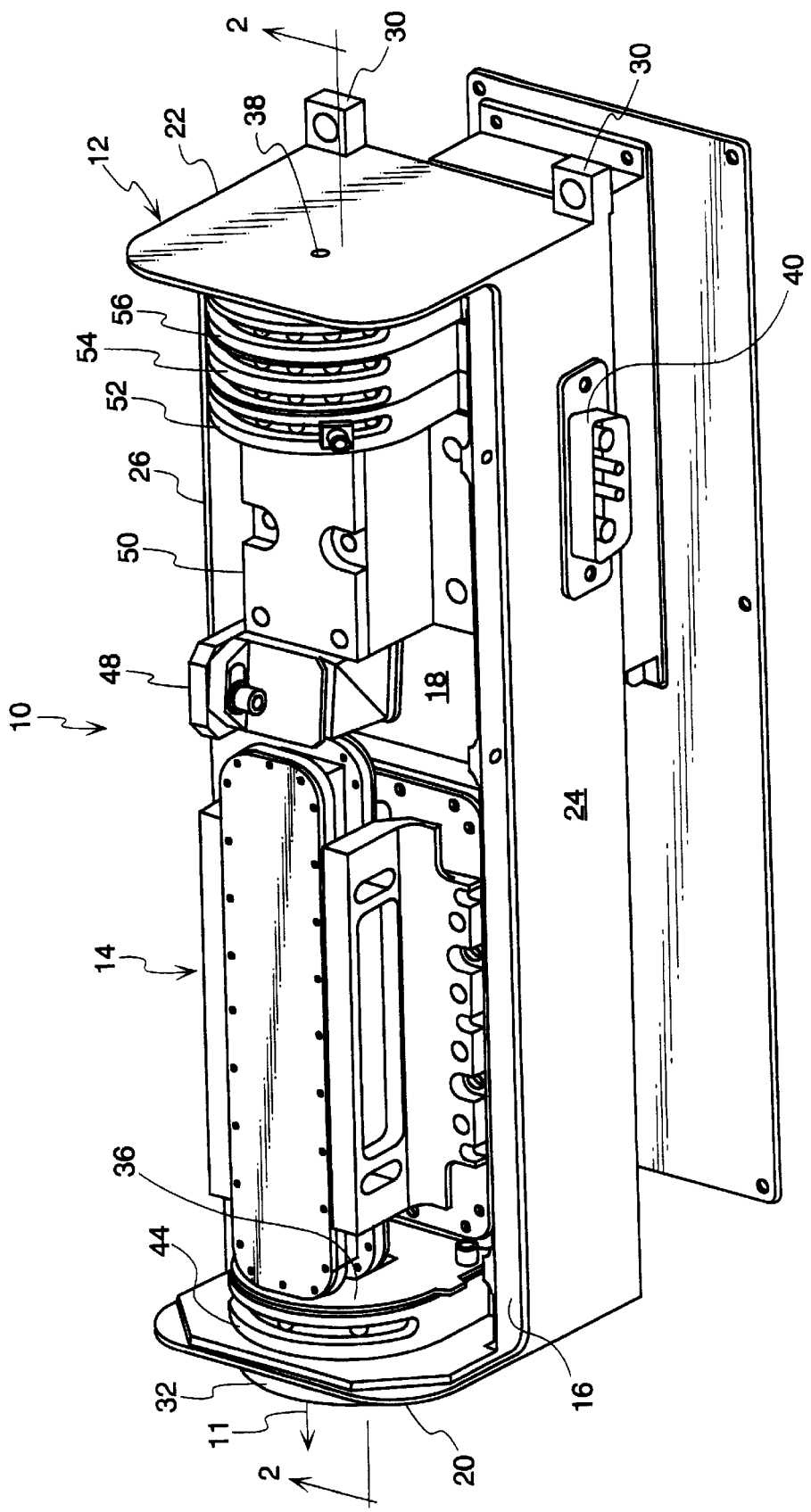
FIG. 1 is a perspective view of the solid-state laser system of the present invention.

While the invention is susceptible to various modifications and alternative forms, a specific embodiment thereof has been shown by way of example in the drawings and will herein be described in detail. It should be understood, however, that it is not intended to limit the invention to the particular forms disclosed. Quite to the contrary, the intention is to cover all modifications, equivalents, and alternatives falling within the spirit and scope of the invention as defined by the appended claims.

DETAILED DESCRIPTION OF THE INVENTION

Figure 2:
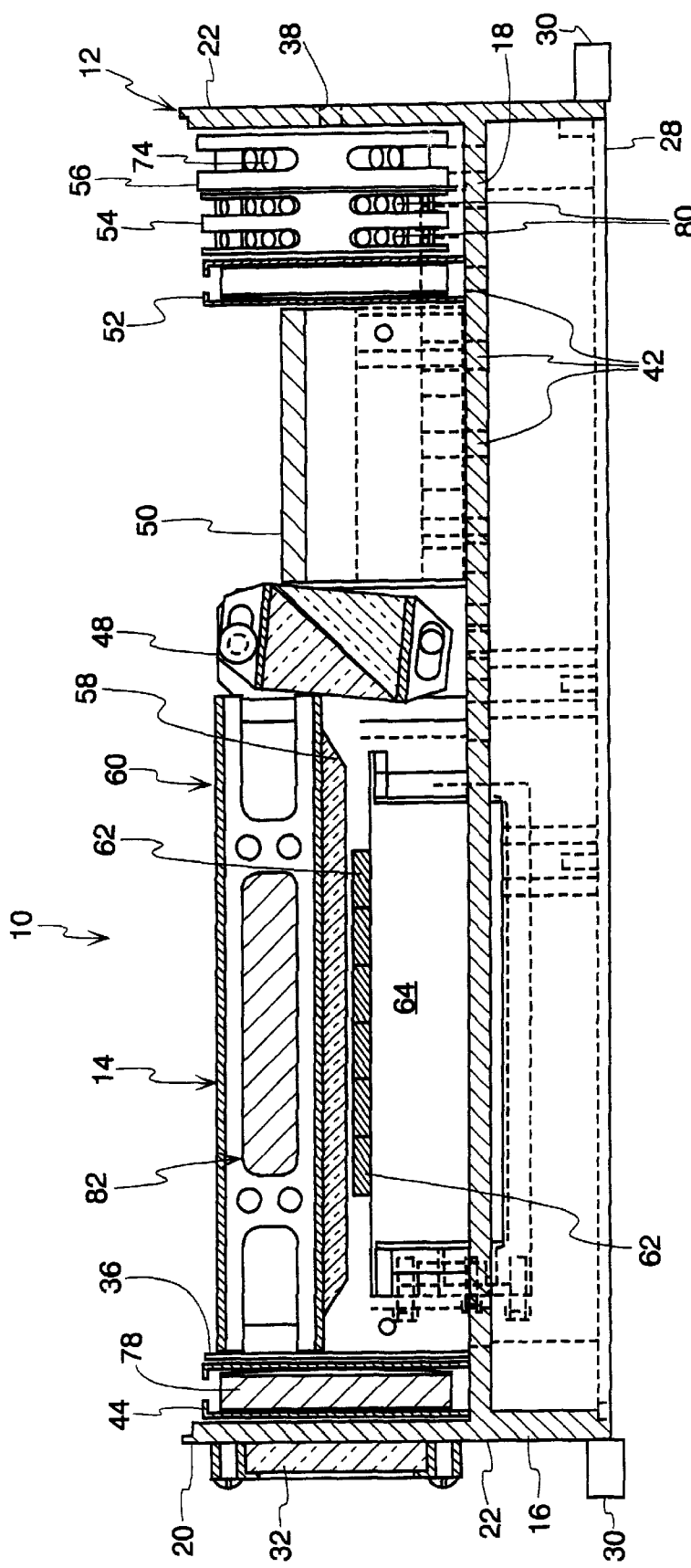
FIG. 2 is a side-elevational, cross-sectional view along 2—2 of FIG. 1 of the solid-state laser system of the present invention.

Referring now to FIG. 1 and FIG. 2, a solid-state laser system 10 for producing a high-power laser beam 11 is illustrated. The laser system 10 includes an optics bench assembly 12 that is the mounting structure for various optical components and a laser head assembly 14 which generates the high-power laser beam 11.

The optics bench assembly 12 includes the optical components (discussed below) and a housing unit 16. The housing unit 16 is a rectangular block of material (e.g. brass) with its center removed. The housing unit 16 includes a floor 18, a first end piece 20, a second end piece 22, a first sidewall 24, a second sidewall 26, and a bottom cover 28. Mounts 30 are integrally formed in the housing unit 16 to secure the laser system 10 into a larger assembly.

With particular reference to FIG. 2, the first end piece 20 includes a beam output window 32 for the exiting of the laser beam 11. The second end piece 22 includes an alignment window 38 which is centered on the axis of the laser beam 11. The alignment window 38 is covered by removable opaque plug. When the plug is removed, a low-power, eye-safe laser beam (e.g. a He—Ne laser) from an external source can be sent through this window 38 to determine where the exact location of the laser beam 11 will be when the laser system 10 is operated. Thus, the operator of the laser system 10 is not required to align the beam with the optical components.

To provide electrical connection for the laser system 10, the first sidewall 24 includes an electrical port which provides access for the wires conducting the electrical energy to the laser system 10. Wires simply pass from the internal components within the housing 16 to a connector assembly 40 located within the port. An external electrical drive and control system would then be coupled to the connector assembly 40.

As best seen in FIG. 2, the floor 18 of the housing unit 16 has several bores 42 for mounting various components. Some of these bores 42 may be threaded while some may simply act as through-bores for receiving fasteners from the underside of the optics bench assembly 12 that threadably engage threaded bores on the optical components.

Figure 3:
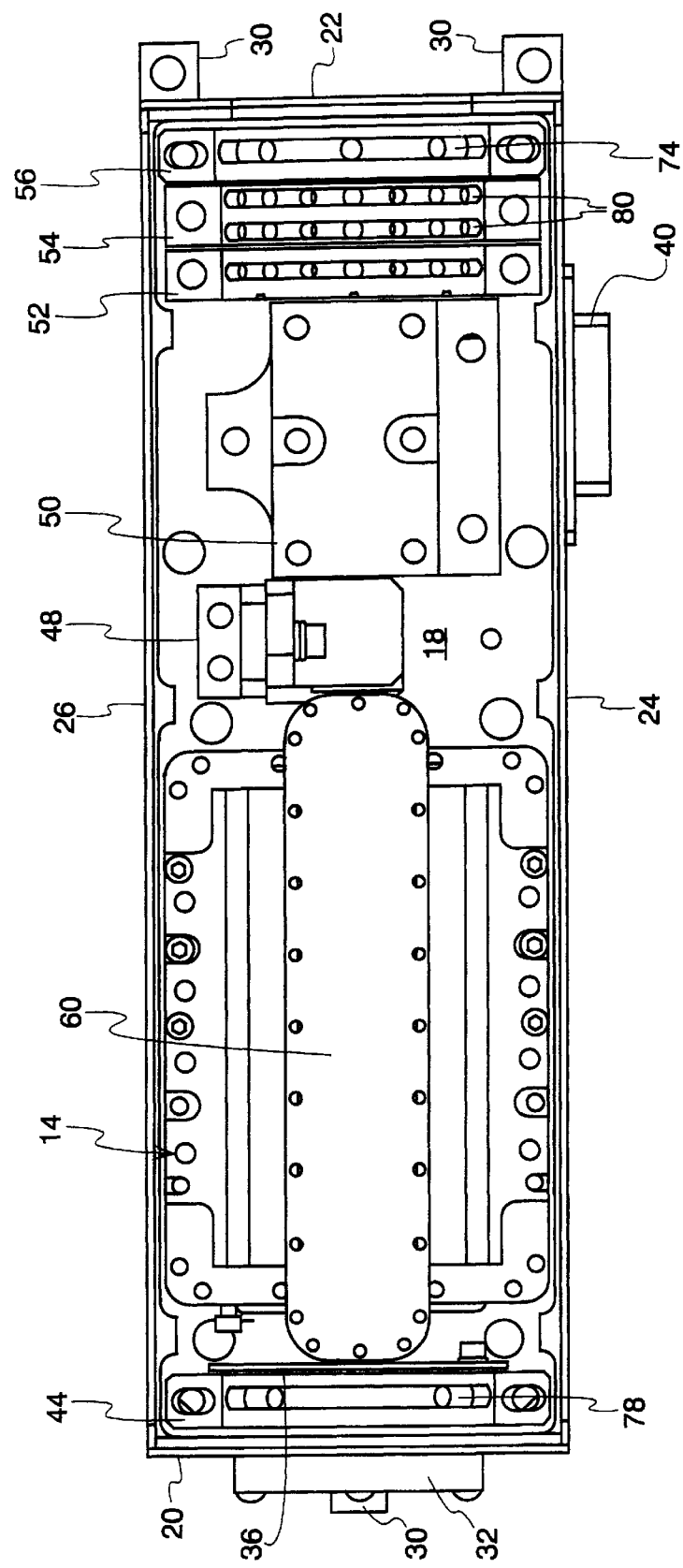
FIG. 3 is a top view of the solid-state laser system of the present invention.

FIGS. 1, 2, and 3 also illustrate the optical components utilized in one preferred operational system that provides a pulsed mode of operation. These components include an output coupling (OC) mirror assembly 44, a polarizer cube 48, an electro-optic Q-switch 50, a waveplate 52, a Risley prism pair 54, and a highly-reflective (HR) mirror assembly 56. Additionally, an aperture assembly 36 is positioned adjacent to the OC mirror assembly 44. Thus, when the laser head assembly 14 converts the electrical energy into optical energy, these optical components act upon that optical energy to produce the resultant laser beam 11.

Focusing now on FIG. 2, the laser head assembly 14 includes a laser medium 58, a laser medium heat sink assembly 60, laser diode arrays 62, and a diode array heat sink assembly 64. The laser medium 58 is disposed between the laser medium heat sink assembly 60 and the diode arrays 62 that are adjacent to the diode array heat sink assembly 64. In operation the diode arrays 62 emit energy at a first wavelength that is absorbed by the laser medium 58 and converted to energy at a second wavelength resulting in laser beam 11.

Figure 4:
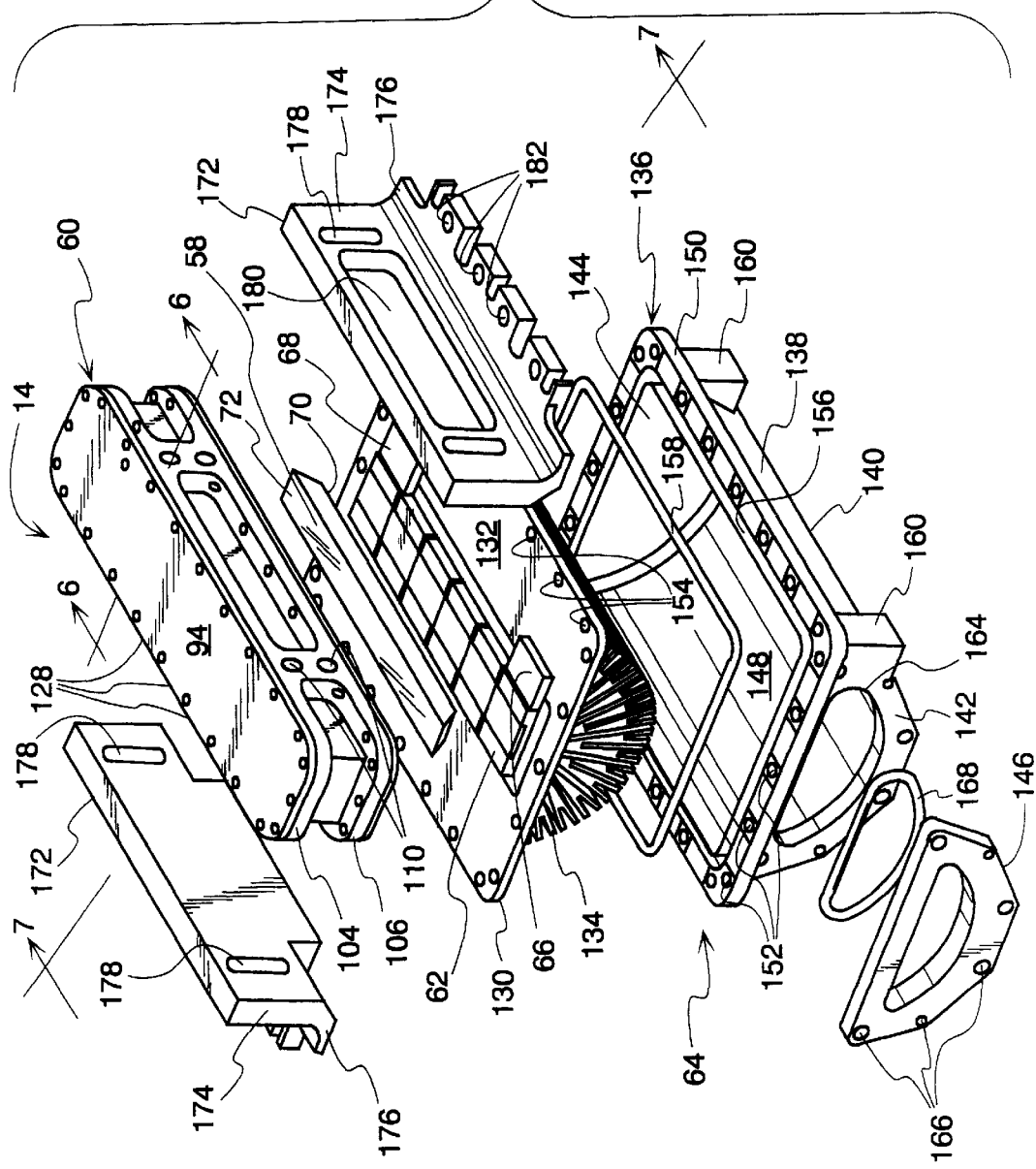
FIG. 4 is an exploded view of the laser medium heat sink assembly, diode array assembly, laser medium, and diode array heat sink assembly of the present invention.
Figure 5:
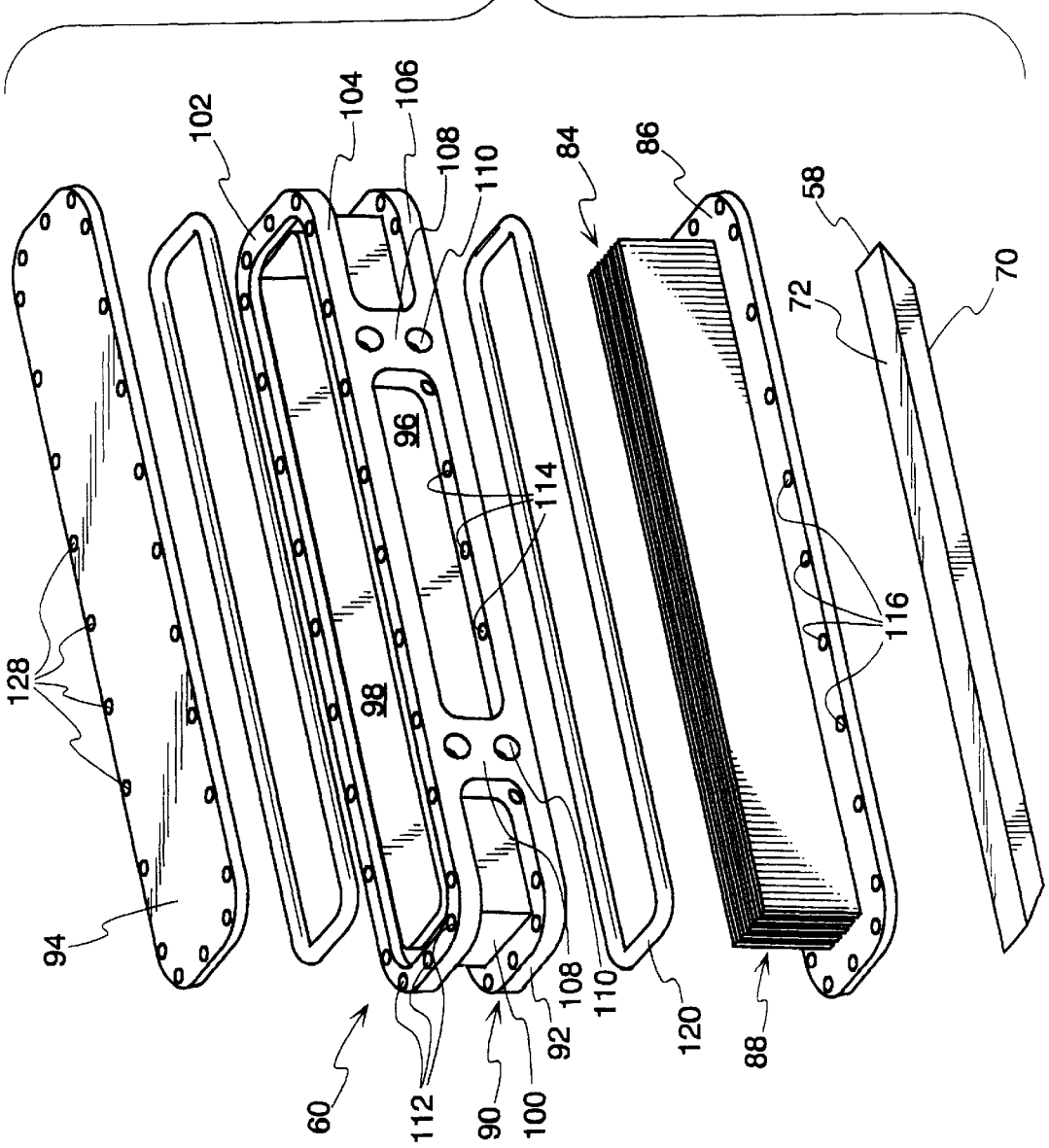
FIG. 5 is an exploded view of the laser medium heat sink assembly and laser medium of the present invention.
Figure 6:
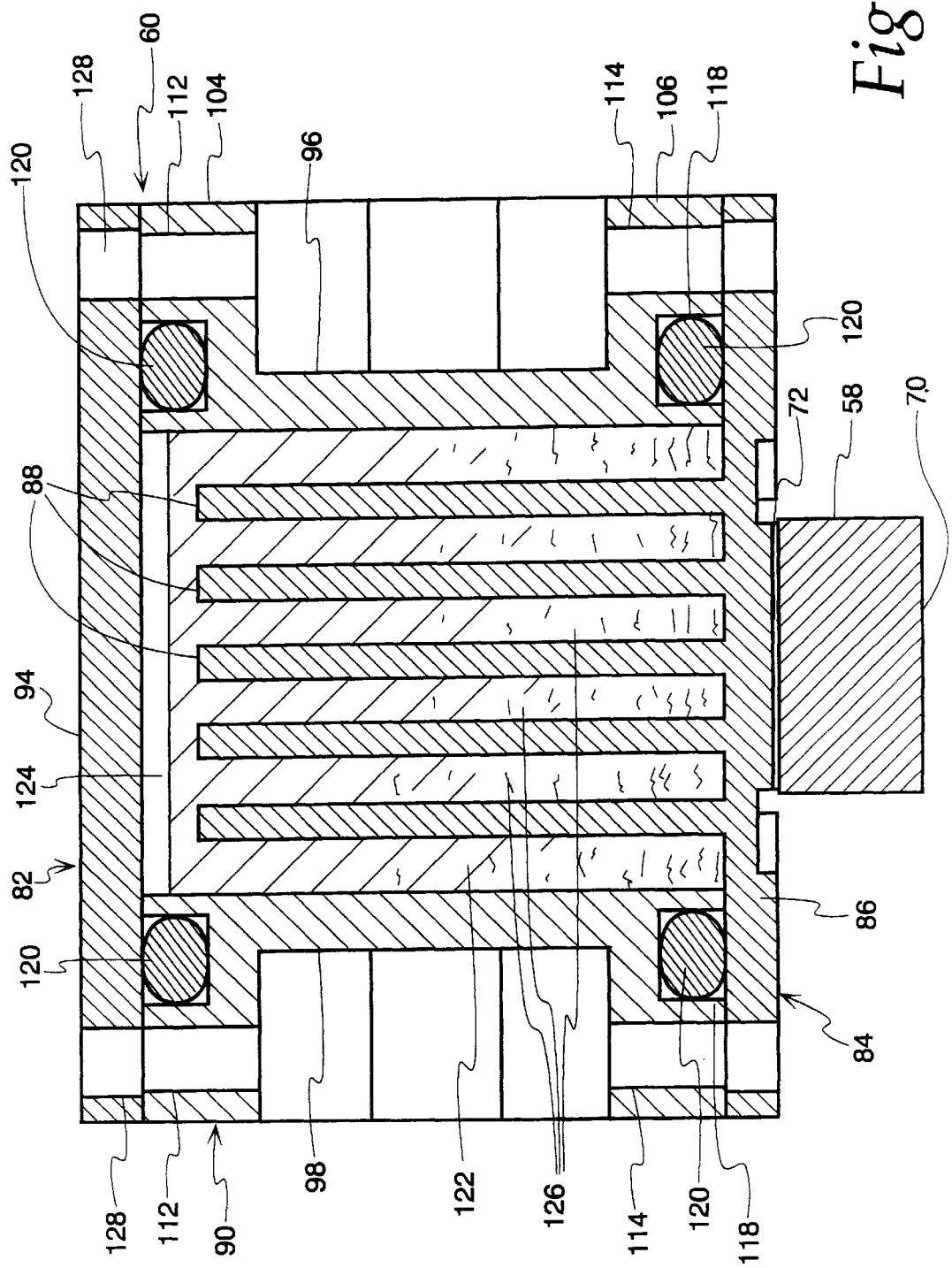
FIG. 6 is a front cross-sectional view along 6—6 of FIG. 4 of the laser medium heat sink assembly and laser medium.

Each laser diode array 62 includes a plurality of laser diode bars which convert electrical energy into optical energy. Six diode arrays 62 are shown in FIG. 4. To improve the thermal efficiency of the entire system, each laser diode array 62 is soldered to the diode array heat sink 64. The laser diode arrays 62 are usually of the type having a non-electrically conductive lower substrate (e.g. Beryllium Oxide) as shown, for example, in U.S. Pat. No. 5,128,951 to Karpinski which is herein incorporated by reference in its entirety. The laser diode arrays 62 are electronically connected in series with each other. Consequently, there is one electrical input wire connected to an input contact (solder pad) 66 and one electrical output wire connected to an output contact (solder pad) 68 for all of the laser diode arrays 62.

As mentioned above, the optical energy from the laser diode arrays 62 is absorbed by the laser medium 58. The amount of absorption of energy by the laser medium 58 at a given wavelength depends on various factors such as the type of dopants provided in the laser medium 58, the concentration of dopants, and the temperature at which the laser medium 58 is operated.

In one preferred embodiment, if the laser medium 58 is made from Neodymium (3+) doped, Yttrium-Aluminum Garnet (Nd:YAG), the peak absorption occurs at about 808 nm. Also, other laser mediums such as Nd:YLF can be used. When the laser diodes from the laser diode arrays 62 are made of gallium arsenide with aluminum doping (AlGaAs), they emit radiation at approximately 808 nm which matches the maximum absorption spectrum for the Nd:YAG material. When the laser medium heat sink 60 is approximately 30–40° C., the Nd:YAG laser medium in direct contact with the laser medium heat sink 60 absorbs the 808 nm energy well. When an Nd:YAG laser medium absorbs energy at 808 nm, it then releases energy at a wavelength of about 1064 nm that results in laser beam 11.

Still referencing FIGS. 1–3, to produce laser resonation, a reflective surface is positioned outside of each end of the laser medium 58 to cause energy to be continuously sent through the laser medium 58. At one end, the HR mirror assembly 56 is positioned adjacent to the second end piece 22 of the optics bench 12 and connected thereto with fasteners. The HR mirror assembly 56 includes a high-reflective (HR) mirror 74 with a front surface that has a reflectivity value of at least about 99% when the wavelength is 1064 nm. Also, the mirror 74 transmits energy at other wavelengths such that an alignment beam that is sent through the alignment window 38 is transmitted through the HR mirror 60 and into other optical components.

At the other end, an output coupling (OC) mirror assembly 44 is positioned adjacent to the first end piece 20 of the optics bench 12 and connected thereto with fasteners. The OC mirror 78 has a partially reflective coating on its surface such that a predetermined amount of energy is transmitted therethrough and released through the beam output window 32 as the laser beam 11. The remaining energy is reflected back through the optical components. The reflectivity of the OC mirror 78 determines the overall output in the laser beam 11. Also, the reflectivity must be enough to produce resonation through the laser medium 58. The OC mirror 78 can have a reflectivity that ranges from about 5% to about 94% (i.e. about 95% to 6% is transmitted as laser beam 11) with the optimum value being dependent on the application. In a preferred embodiment, the reflectivity of the OC mirror 78 is about 90% for a laser system 10 operating in a CW mode. For a laser system operating in a pulsed mode, the reflectivity of the OC mirror 153 is approximately 70%. An OC mirror with a reflectivity of about 80% would serve both modes of operation.

In a preferred embodiment, the polarizer cube 48 is positioned adjacent to the laser head assembly 14 and is pivotally mounted to the floor 18 of the optics bench 12. The cube 48 includes two joined prisms with alternating layers of material having high and low indices of refraction for effecting a polarization split of the laser beam 11.

If the laser system 10 is to provide a pulsed output, the electro-optic Q-switch 50 is disposed between the polarizer cube 48 and the waveplate 52, aligned with the central axis of the laser medium 58 and mounted to the floor 18 of the optics bench 12 with fasteners. When the Q-switch 50 "opens" to allow for optical transmission, energy can resonate between the two reflective surfaces such that a high-energy, short-duration pulse exits from the system 10. It should be noted that the Q-switch 50 can be placed on either side of the laser medium 58 and that other types of Q-switches, such as an acousto-optic Q-switch or passive Q-switch, can be used.

Further adjustment of the laser beam 11 is provided by the waveplate 52 and Risley prism pair 54. The waveplate 52 is positioned between the Q-switch 50 and the Risley prism pair 54 and is connected to the optics bench 12 with fasteners. The Risley prism pair 54 is positioned between the waveplate 52 and HR mirror assembly 56 and includes two prisms 80 that are rotatably mounted to the floor 18 of the optics bench 12. The Risley prism pair 54 is used to substantially linearly deflect a beam of wave energy. The prisms 80 can be rotated to effectuate maximum resonation of beam energy along the central axis of the laser medium 58. The waveplate rotates the polarization state of the laser beam 11 to allow proper Q-switch operation.

The laser system 10 may require a specific internal environment for optimum operation. For example, a cover can completely enclose and seal the system 10 which then could be back-filled with dry nitrogen if it is equipped with a simple valve on its external surface. Alternatively, the final assembly step could be performed in a low-moisture atmosphere. In yet a further alternative, the laser system 10 may include a desiccant within the housing 14 that absorbs the moisture once a cover is sealed in place.

To provide passive cooling, the laser diodes 62 and laser medium 58 are heat sunk to unique heat exchangers having phase change materials. These components are illustrated in FIGS. 4–7 and will now be described.

Referring now FIGS. 4–7, exploded and cross-sectional views of the laser medium heat sink assembly 60, the diode array heat sink assembly 64 and laser medium 58 are shown. The laser medium heat sink assembly 60 includes a laser medium heat exchanger 84 with a base plate 86 having a plurality of fins 88 and a housing 90 for enclosing the heat exchanger 84. The laser medium heat exchanger 84 can be made from any highly-conductive and preferably light-weight material including metals, metal composites, and highly-conductive non-metals.

In a preferred embodiment, the fins 88 are substantially rectangular in shape, extend along the length of the laser medium 58, and are disposed parallel with respect to each other to form interstices 126 therebetween. The fins 88 may have a variety of shapes and are not limited to the substantially rectangular fins 88 shown in FIG. 5. Other variations that produce heat-conducting extended surfaces include tube fins, spines, grooves, plate fins of other shapes, plate baffle constructions, internal fin-tube constructions, and a shell-and-tube construction. While the fins 88 are copper and shown as parallel, they can be made from any highly-conductive metal or non-metal and have a radial configuration as is shown with respect to the laser diode array heat sink 64.

The housing 90 includes a body 92 and a cover 94. The body 92 is formed by machining a substantially rectangular block of material (e.g. brass or copper) to remove its center portion leaving a substantially rectangular collar with a first sidewall 96, a second sidewall 98, a first end wall 100, and a second end wall 102. The inner surfaces of the walls 96, 98, 100, 102 are fairly smooth. The body 92 has an integrally formed upper lip 104 at the upper portion of the walls 96, 98, 100, 102 and a lower lip 106 at the lower portion of the walls 96, 98, 100, 102. The upper and lower lips 104, 106 extend outwardly from the walls 96, 98, 100, 102 and are interconnected by integrally formed pillars 108 having bores 110 machined therein for accepting fasteners. The housing 90 can be made from materials other than copper or brass and, preferably, from materials that are non-corrosive and light weight.

A plurality of apertures 112 are formed in the upper lip 104 to be in positional agreement with a plurality of apertures 114 formed in the lower lip 106. The apertures 112 and 114 are also in registry with apertures 116 in the base plate 86 of the laser medium heat exchanger 84. The lower portion of the body 92 has an integrally formed channel 118 (FIG.

6) for receiving an O-ring 120 to prevent leaks. The body 92 is secured to the base plate 86 of the laser medium heat exchanger 84 with fasteners passed through apertures 114 in the lower lip 106 and apertures 116 in the base plate 86 sandwiching the O-ring 120 between the base plate 86 and the body 92. The upper portion of the body 92 has a similar channel for accepting an O-ring.

Once the body 92 is mounted to the base plate 86 of the heat exchanger 84, phase change material (PCM) 122 is added within a chamber 124 defined by the inner surfaces of the walls 96, 98, 100, 102 of the body 92, and the interstices 126 of the fins 88. The cover 94 is then added to the assembly which is a substantially rectangular plate having apertures 128 in positional agreement with the apertures 112 of the upper lip 104 for accepting fasteners. The cover 94 seals the chamber 124. In an alternative embodiment, the housing 90 can constitute a unitary body.

As shown in FIG. 4, six diode arrays 62 are disposed adjacent to a lower face 70 of the laser medium 58. The lower face 70, where the energy from the laser diode arrays 62 enters the surface of the laser medium 58, is covered with a coating that allows external transmission of 808 nm radiation but is internally reflective of 1064 nm radiation. An upper face 72 of the laser medium is covered with a coating reflective of both 1064 and 808 nm radiation. One example of such a coating is 2000 Angstroms of silver which is deposited on the laser medium 58 with a vacuum-evaporation process. Thus, optical energy from the diode arrays 62 enters the laser medium 58 at the lower face 70, travels through the laser medium 58, bounces off the internally reflective coating on the upper surface 72 and is transmitted back through the laser medium 58. This path is sufficiently long for the laser medium 58 to absorb most of the energy from the laser diode arrays 62. Any heat produced in the laser medium 58 is conducted into the laser medium heat exchanger 84.

To efficiently conduct heat from the laser medium 58 to the laser medium heat sink assembly 60, the laser medium 58 preferably is attached to the base plate 86 with highly conductive material. A preferred embodiment involves attaching the laser medium 58 directly to the laser medium heat sink assembly 60 with a thermally conductive adhesive such as a thermally conductive room temperature vulcanization (RTV) epoxy.

Figure 7:
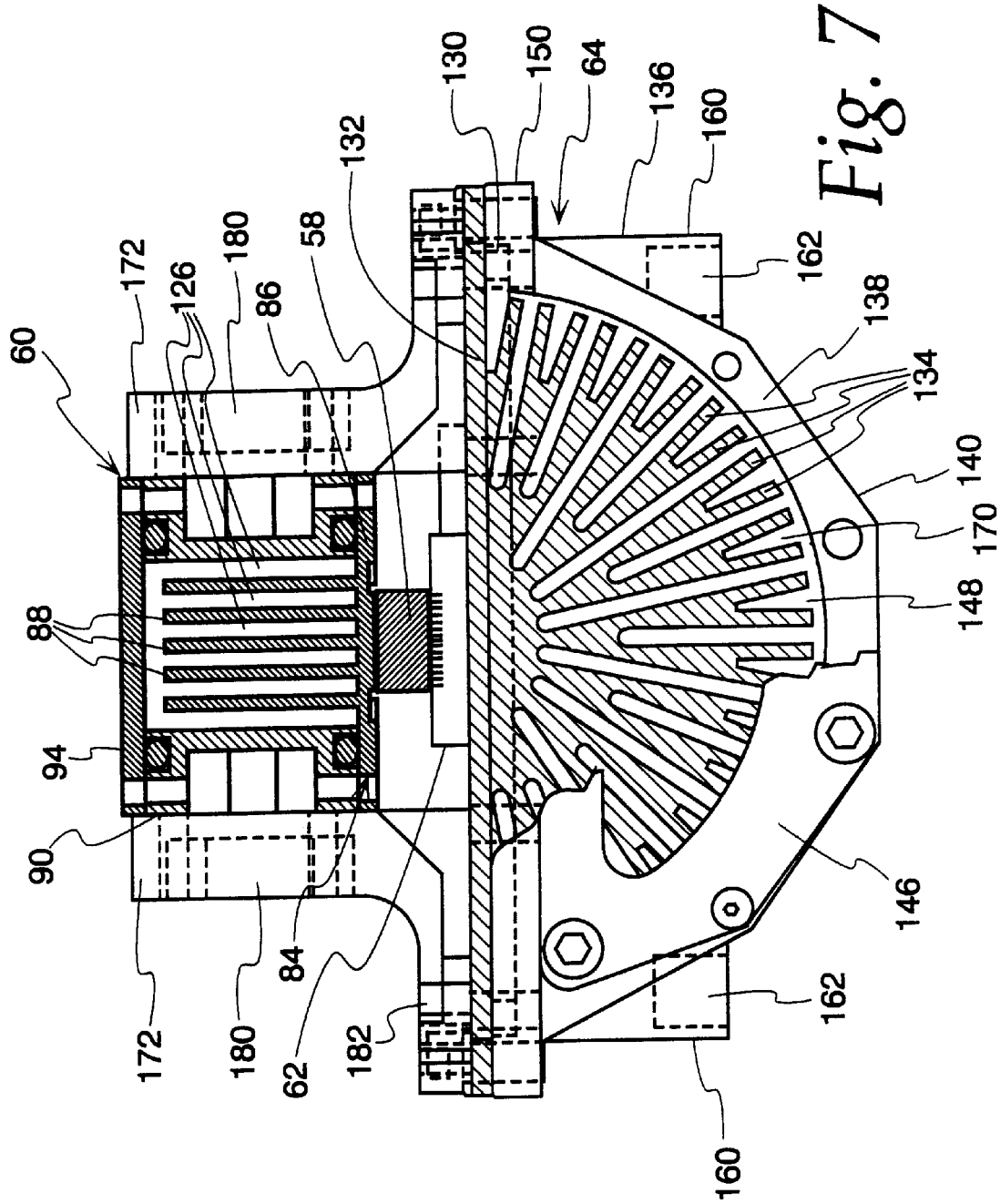
FIG. 7 is a front cross-sectional view along 7—7 of FIG. 4 showing the laser medium heat sink assembly, laser medium, diode array, and diode array heat sink assembly.

Referring now to FIG. 7 and with particular reference to FIG. 4, cross-sectional and exploded views of the laser head assembly 14 are shown. The diode array heat sink 64 includes a diode array heat exchanger 130 with a base plate 132 having a plurality of fins 134 and a housing 136 for enclosing the heat exchanger 130.

In a preferred embodiment, the fins 134 are branched and extend radially from the base plate 132 along the length of the laser medium 58. The extended surfaces may have a variety of shapes and are not limited to the radially branched fins shown in FIG. 4. Other variations can include tube fins, spines, grooves, plate fins of other shapes, plate baffle constructions, internal fin-tube constructions, and a shell-and-tube construction.

The housing 136 includes a body 138 having a semi-cylindrical surface 140, a first end wall 142, a second end wall 144, and an access cover 146 defining a chamber 148 in which a phase change material is placed. At an upper end, the body 138 has a lip 150 integrally formed therewith. Apertures 152 formed in the lip 150 accept fasteners and are in registry with apertures 154 of the base plate 132. A channel 156 for accepting an O-ring 158 is also integrally formed in the body 138 at the upper end.

Because the heat exchanger 130 is filled with phase change material, the first end wall 142 has a hole 164 for providing access to the chamber 148 within the body 138. The access cover 146 includes apertures 166 and an integrally formed channel for accepting an O-ring 168 to provide sealing engagement with the first end wall 142. The access cover 146 is secured to the first end wall 142 with fasteners.

When the base plate 132 is mounted on the lip 150, a sealing engagement is formed with the O-ring 158 positioned within the channel 156. With the apertures 154 of the base plate 132 in alignment with the apertures 152 in the lip 150, fasteners are passed therethrough to securely mount the diode array heat exchanger 130.

To mount the diode array heat sink 64 to the optics bench 12, fasteners are passed from the optics bench 12 to bores 162 in mounting pillars 160.

The diode arrays 62 are directly contacting the base plate 132 of the heat exchanger 130 to thermally conduct heat away from the diode arrays 62 and into the diode array heat sink 64. Thus, heat produced by the diodes is transferred into the heat sink 64 where it is ultimately absorbed by the PCM.

To place the laser medium 58 directly over the laser diode arrays 62, brackets 172 position and secure the laser medium heat sink assembly 60 to the base plate 132 of the diode array heat exchanger 130. Each bracket 172 has a plate 174 with an integrally formed flange 176. The plate 174 has two slots 178 aligned with bores 110 in the heat sink body 92 for passing fasteners therethrough. The flange 176 of the bracket 172 has apertures 182 for securing the bracket 172 to the base plate 132 of the diode array heat exchanger 130.

Because of the desire to reduce the weight of the overall system, additional material is machined from the various components in areas where the structural integrity of the system 10 is not compromised. For example, a recess 180 is also formed in the plate 174 for reducing the weight of the unit.

The phase change material (PCM) 122 placed within the chamber 124 of the laser medium heat sink assembly 60 and the PCM 170 placed into the chamber 148 of the diode array heat sink 64 change from solid to liquid at a desired temperature depending upon the demands of a particular application. Selecting as a working medium a PCM that transitions from solid to liquid as opposed to liquid to gas is advantageous in that the PCM dissipates waste heat by conduction as opposed to conduction and convection. Also, the PCM provides thermal control of elements in thermal communication with the PCM. Thermal control is provided by the PCM's latent heat associated with the phase change. A PCM in its solid phase will continue to absorb energy and remain in its "melt phase" at a known temperature until a specified amount of heat is absorbed to complete the entire transition from solid to liquid phase. Thus, any element in intimate contact with the PCM undergoing a phase change will be held at a generally constant temperature that coincides with the PCM's melting temperature until the phase change is complete.

The duration of the phase change associated with a particular amount of PCM affects the time period for operating the laser system before reaching catastrophic temperature levels. Selecting a PCM requires consideration of factors other than the desired control temperature and operation period associated with the particular laser application and design. One factor is the ambient temperature of the environment in which the laser system 10 is to operate. A PCM is selected that has a melting point above the maximum ambient temperature of the environment in which the laser system 10 resides so that the PCM will remain in its solid phase before laser operation begins. This temperature is preferably in the range of −35 to 55° C. Other factors include the desired laser power output, size of both the laser medium and the laser diode array, and the efficiency of the laser diodes and laser medium which is proportional to the waste heat.

In a preferred embodiment, gallium is selected as the PCM to serve as the working medium. Gallium has a melting point of 29.8° C. and a latent heat of fusion of 80 J/g. The melting point of gallium closely corresponds to an acceptable operational temperature (30° C.) of the Nd:YAG material of the laser medium in the preferred embodiment. Since it is possible for a PCM to be a solid at room temperature but a liquid slightly above room temperature, integrating the PCM into a heat exchanger is fairly easy. Other possible PCMs include alkyl hydrocarbons, salt hydrates, and low temperature metallic alloys (fusible alloys).

However, gallium, even when in its liquid phase, does not easily wet to copper or other materials from which the heat exchanger may be constructed. One method for integrating the PCM into a heat exchanger includes heating the heat exchanger to a temperature above the liquid phase of the PCM. This step makes it easier to maintain the PCM in its liquid phase while it is poured into the heat exchanger. The next step involves heating the PCM until it melts to facilitate the transfer of PCM into the heat exchanger. Next, the heat exchanger is coated with a highly active organic fluxing agent such as Flux No. 4 by the Indium Corporation of America of Utica, N.Y. which helps the PCM wet onto the surface of the heat exchanger. Then, the PCM is injected or poured into the heat exchanger. Finally, excess fluxing agent is removed. The last two steps may be performed simultaneously.

The laser system 10 including a slab-shaped Nd:YAG laser medium 58 having dimensions of 3.1 mm (thickness) by 6.2 mm (width) by 83.3 mm (distance tip-to-tip) has been tested. This slab was bonded to a gallium-filled heat sink with thermally conductive RTV. The laser medium heat exchanger 84 with fins 88 was machined from copper and the chamber 124 had a gallium PCM volume of 0.26 in$^3$.

Six diode arrays each having 15 diode bars were soldered to the diode array heat sink. The diode array heat exchanger was also machined from copper having radially extending fins that circumscribe a semi-circle having a radius of 0.82 in. The chamber 148 of the diode array heat sink having a PCM volume of 1.2 in$^3$ was filled with gallium.

Figure 8:
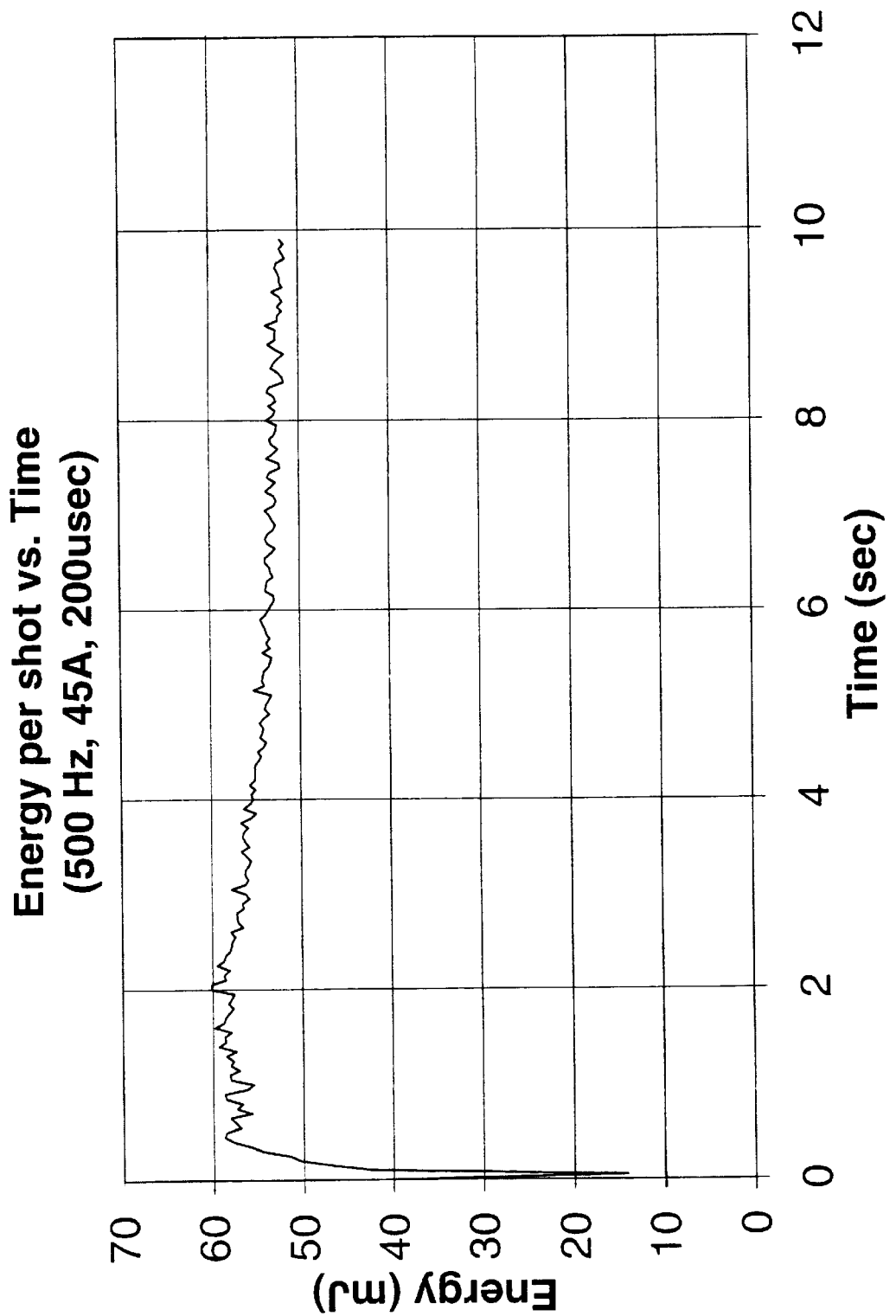
FIG. 8 is a plot of the output of the laser system versus time when operated at an input current of 45 A, repetition rate of 500 Hz, and pulsewidth of 200 $\mu$sec.

Referring now to FIG. 8, there is shown a plot of the output of the laser system 10 versus time when the system was operated at an electrical input of 45 A, a repetition rate of 500 Hz, a current pulsewidth of 200 μsec and the physical conditions described in the previous paragraph. For a maximum energy output of about 60 mJ, the maximum laser output power is 30 W of 1064 nm energy. The corresponding heat load produced by the slab was calculated to be 83 W and the heat load produced by the diode arrays was calculated to be 520 W. If the power output of the entire system is desired to be less than 30 W, then the time of temperature-controlled operation of the slab and arrays will increase proportionally.

Figure 9:
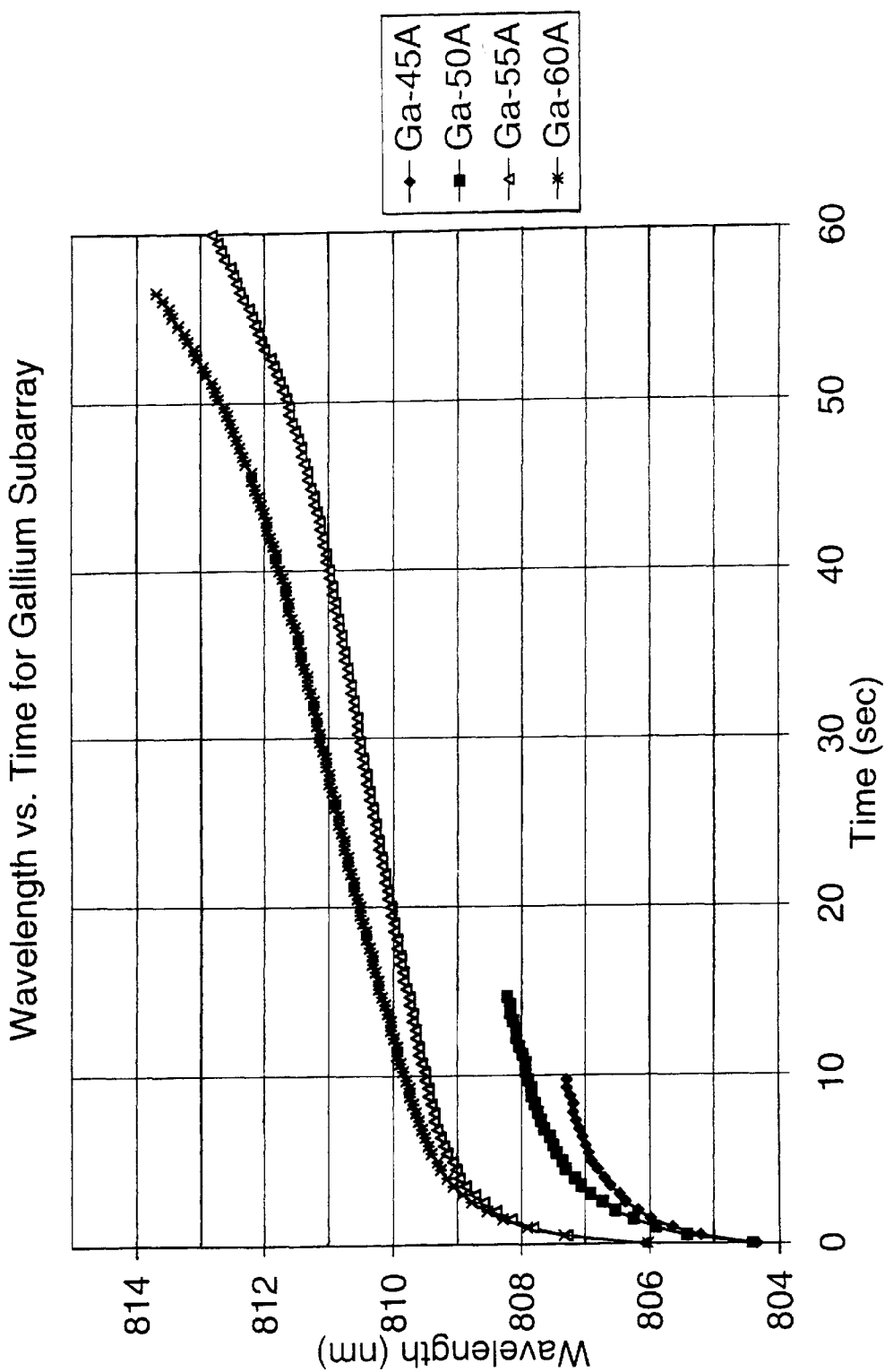
FIG. 9 is a plot of output power wavelength versus time for test runs at peak put currents of 45, 50, 55, and 60 A.

Referring now to FIG. 9, there is shown a plot of the output power wavelength versus time for test runs at peak input currents of 45, 50, 55, and 60 A, a 250 μsec pulsewidth, and repetition rate of 500 Hz but under different physical conditions than described above. The physical conditions included only one diode subarray as opposed to the six previously described. Furthermore, a slightly larger diode array heat exchanger was used. The heat exchanger had twice the effective cross-sectional area for heat dissipation and the fins circumscribed a semi-circle having a radius of 1.16 in instead of 0.82 in previously described. Since the amount of heat dissipation is directly proportional to the effective cross-sectional area, the amount of heat dissipation can be easily calculated if more diode subarrays are added. As a reference point, at 60 A, the waste heat of the diode arrays is about 140 W.

Aluminum doped gallium-arsenide (AlGaAs) diodes shift wavelength by one nanometer for approximately 4° C. change in temperature. For example, over a time period of approximately 60 seconds at an input current of 60 A, the corresponding temperature change of approximately 32° C. was measured (814 nm–806 nm). However, at an input of 60 A and after approximately 3 seconds, the wavelength remains relatively stable for approximately 50 seconds (809 nm to about 812 nm). This flattening out of the curves is associated with the latent heat of fusion of gallium. After about 50 seconds, the rate of the change in wavelength is shown to begin to increase. This change corresponds with the point in time when gallium has completely melted after which gallium behaves as a normal superheated liquid.

In addition, stress tests to verify the survivability of the laser medium slab were conducted at various heat loading levels. For these tests, the slab was bonded with thermally conductive RTV to a gallium-filled diode array heat sink assembly 64 having a PCM volume of 0.26 in$^3$. Various heat loading levels were used and no damage to the slab was observed at an input power of 55 A, 250 μsec pulsewidth, repetition rate of 500 Hz, and run-time of 20 seconds.

It should be noted that after the system is operated, it returns to its starting point prior to operation because the gallium phase change material will eventually solidify. Once at its starting point, the laser system 10 can be operated again.

Each of these embodiments and obvious variations thereof is contemplated as falling within the spirit and scope of the invention, which is set forth in the following claims.

What is claimed is:

1. A passively cooled laser medium assembly comprising:
   a solid-state laser medium for receiving input energy and converting said input energy into output energy and heat;
   a heat sinking structure in direct thermal conductive communication with said solid-state laser medium for receiving said heat; and
   a phase change material in contact with said heat sinking structure changing from a solid form to a liquid form in response to said heat being received in said heat sinking structure, said phase change material changes from said solid form to said liquid form at a temperature above the maximum ambient temperature of said laser medium assembly when not in operation.

2. The passively cooled laser medium assembly of claim 1, wherein said phase change material is gallium.

3. The passively cooled laser medium assembly of claim 1, wherein said phase change material changes from said solid form to said liquid form between about −35° C. and 55° C.

4. The passively cooled laser medium assembly of claim 1, wherein said solid-state laser medium and said heat sinking structure are connected through a layer of epoxy.

5. The passively cooled laser medium assembly of claim 1, wherein said heat sinking structure is directly in contact with said laser medium.

6. The passively cooled laser medium assembly of claim 1, wherein said heat sinking structure comprises a base plate with a plurality of surfaces extending from said base plate and forming interstices therebetween, wherein said phase change material is in contact with said extended surfaces.

7. The passively cooled laser medium assembly of claim 1, wherein said laser medium is Nd:YAG.

8. The passively cooled laser medium assembly of claim 1, wherein said phase change material is a fusible metallic alloy.

9. The passively cooled laser medium assembly of claim 6, wherein said heat sinking structure further comprises means for containing said phase change material around said extended surfaces.

10. The passively cooled laser medium assembly of claim 6, wherein said plurality of surfaces extend radially from said base plate.

11. The passively cooled laser medium assembly of claim 9, wherein said containing means includes a shell engaging said base plate and enclosing said extended surfaces so as to form a chamber.

12. The passively cooled laser medium assembly of claim 11, wherein said containing means further comprises means for accessing said chamber.

13. A passively cooled laser diode assembly comprising:
at least one laser diode bar for receiving electrical energy and converting said electrical energy to optical energy and heat;
a heat sinking structure in direct thermal conductive communication with said laser diode bar for receiving said heat, said heat sinking structure comprises a base plate with a plurality of surfaces extending from said base plate and forming interstices therebetween; and
a phase change material in contact with said extending surfaces of said heat sinking structure and changing from a solid form to a liquid form in response to said heat being received in said heat sinking structure.

14. The passively cooled laser diode assembly of claim 13, wherein said phase change material is gallium.

15. The passively cooled laser diode assembly of claim 13, wherein said phase change material changes from said solid form to said liquid form at a temperature above the maximum ambient temperature of said passively cooled laser diode assembly when not in operation.

16. The passively cooled laser diode assembly of claim 13, wherein said phase change material changes from said solid form to said liquid form between about −35° C. and 55° C.

17. The passively cooled laser diode assembly of claim 13, wherein said at least one laser diode bar and said heat sinking structure are connected through a layer of epoxy.

18. The passively cooled laser diode assembly of claim 13, wherein said heat sinking structure is directly in contact with said laser diode.

19. The passively cooled laser diode assembly of claim 13, wherein said heat sinking structure further comprises means for containing said phase change material around said extended surfaces.

20. The passively cooled laser diode assembly of claim 13, wherein said phase change material is a fusible metallic alloy.

21. The passively cooled laser diode assembly of claim 19, wherein said containing means includes a shell engaging said base plate and enclosing said extended surfaces so as to form a chamber.

22. The passively cooled laser diode assembly of claim 21, wherein said containing means further comprises means for accessing said chamber.

23. A passively cooled laser medium assembly comprising:
a solid-state laser medium for receiving input energy and converting said input energy into output energy and heat;
a heat sinking structure in direct thermal conductive communication with said solid-state laser medium for receiving said heat; and
a phase change material in contact with said heat sinking structure changing from a solid form to a liquid form in response to said heat being received in said heat sinking structure, wherein said phase change material changes from said solid form to said liquid form between about −35° C. and 55° C.

24. The passively cooled laser medium assembly of claim 23, wherein said phase change material is a fusible metallic alloy.

25. The passively cooled laser medium assembly of claim 23, wherein said heat sinking structure and said laser medium are connected through a layer of epoxy.

26. A passively cooled laser diode assembly, comprising:
at least one laser diode bar for receiving electrical energy and converting said electrical energy to optical energy and heat;
a heat sinking structure in direct thermal conductive communication with said laser diode bar for receiving said heat; and
a phase change material in contact with said heat sinking structure changing from a solid form to a liquid form in response to said heat being received in said heat sinking structure, wherein said phase change material changes from said solid form to said liquid form at a temperature above the maximum ambient temperature of said passively cooled laser diode assembly when not in operation.

27. The passively cooled laser diode assembly of claim 26, wherein said phase change material is a fusible metallic alloy.

28. The passively cooled laser diode assembly of claim 26, wherein said laser diode is coupled to said heat sinking structure through a solder connection.

29. A passively cooled laser diode assembly, comprising:
at least one laser diode bar for receiving electrical energy and converting said electrical energy to optical energy and heat;
a heat sinking structure in direct thermal conductive communication with said laser diode bar for receiving said heat; and
a phase change material in contact with said heat sinking structure changing from a solid form to a liquid form in response to said heat being received in said heat sinking structure, wherein said phase change material changes from said solid form to said liquid form between about −35° C. and 55° C.

30. A passively cooled laser diode assembly of claim 29, wherein said phase change material is a fusible metallic alloy.

* * * * *

UNITED STATES PATENT AND TRADEMARK OFFICE
CERTIFICATE OF CORRECTION

PATENT NO. : 6,351,478 B1
DATED : February 26, 2002
INVENTOR(S) : Heberle

It is certified that error appears in the above-identified patent and that said Letters Patent is hereby corrected as shown below:

Column 11,
Line 35, after "surfaces" insert -- radially --

Signed and Sealed this

Twenty-fifth Day of June, 2002

*Attest:*

*Attesting Officer*

JAMES E. ROGAN
*Director of the United States Patent and Trademark Office*